(12) United States Patent
Kim et al.

(10) Patent No.: US 10,573,843 B2
(45) Date of Patent: Feb. 25, 2020

(54) LIGHT-EMITTING DEVICE HAVING AN ELECTRODE WITH VARYING SHEET RESISTANCE

(71) Applicant: PROTEQ TECHNOLOGIES LLC, Wilmington, DE (US)

(72) Inventors: KiBeom Kim, Cupertino, CA (US); Kwang Ohk Cheon, San Jose, CA (US); Rui Liu, San Jose, CA (US); Cheng Chen, San Jose, CA (US)

(73) Assignee: Apple Inc., Cupertino, CA (US)

( * ) Notice: Subject to any disclaimer, the term of this patent is extended or adjusted under 35 U.S.C. 154(b) by 194 days.

(21) Appl. No.: 15/747,097

(22) PCT Filed: Jun. 23, 2016

(86) PCT No.: PCT/US2016/039082
§ 371 (c)(1),
(2) Date: Jan. 23, 2018

(87) PCT Pub. No.: WO2017/023440
PCT Pub. Date: Feb. 9, 2017

(65) Prior Publication Data
US 2018/0374423 A1 Dec. 27, 2018

Related U.S. Application Data

(60) Provisional application No. 62/201,209, filed on Aug. 5, 2015.

(51) Int. Cl.
*G09G 3/3233* (2016.01)
*H01L 51/52* (2006.01)
*H01L 27/32* (2006.01)

(52) U.S. Cl.
CPC ...... *H01L 51/5215* (2013.01); *H01L 27/3209* (2013.01); *H01L 51/5209* (2013.01);
(Continued)

(58) Field of Classification Search
CPC ............. H01L 51/5215; H01L 51/5234; H01L 27/3209; H01L 51/5225; H01L 51/5209;
(Continued)

(56) References Cited

U.S. PATENT DOCUMENTS 6,414,431 B1 7/2002 Yu et al.
6,593,690 B1 7/2003 Boyle et al.
(Continued)

FOREIGN PATENT DOCUMENTS

JP 2002318553 10/2002
JP 2006252866 9/2006

OTHER PUBLICATIONS

JP2006-252866, Machine translation, Sep. 2006 (Year: 2006).*
JP2002-318553, Machine translation, Oct. 2002 (Year: 2002).*

*Primary Examiner* — Tracie Y Green
(74) *Attorney, Agent, or Firm* — Treyz Law Group, P.C.; G. Victor Treyz; Joseph F. Guihan

(57) ABSTRACT

An organic light-emitting diode may have transparent electrodes. An organic emissive layer may be interposed between the electrodes. The emissive layer may emit light in response to current injected from the electrodes. The organic light-emitting diode electrodes may cover an electrode area. The electrode area may be square or may have other shapes. To enhance brightness uniformity, portions of the electrodes in a peripheral region (H1, H2) of the electrode area may have higher sheet resistances than a central portion of the electrode area. The electrode area may be square and may have four corners. The higher sheet resistances may be associated with regions of the electrode area adjacent to the corners. Elevated sheet resistances may be produced by forming the electrodes with different thicknesses in different areas or by providing supplemental conductive structures (104) in selected areas of the electrode area.

20 Claims, 9 Drawing Sheets

(52) U.S. Cl.
CPC ...... *H01L 51/5212* (2013.01); *H01L 51/5225* (2013.01); *H01L 51/5228* (2013.01); *H01L 51/5234* (2013.01); *H01L 2251/5323* (2013.01); *H01L 2251/5361* (2013.01); *H01L 2251/558* (2013.01)

(58) Field of Classification Search
CPC ....... H01L 2251/558; H01L 2251/5361; H01L 51/5228; H01L 51/5212; H01L 2251/5323
See application file for complete search history.

(56) References Cited

U.S. PATENT DOCUMENTS

| | | |
|---|---|---|
| 6,686,581 B2 | 2/2004 | Verhoeckx et al. |
| 6,900,470 B2* | 5/2005 | Kobayashi .......... H01L 27/3244 257/40 |
| 7,990,054 B2 | 8/2011 | Young et al. |
| 8,808,790 B2 | 8/2014 | Zagdoun et al. |
| 9,655,198 B2* | 5/2017 | Krummacher ...... H01L 51/5203 |
| 10,312,412 B2* | 6/2019 | Obata ..................... H01L 33/32 |
| 2004/0164674 A1 | 8/2004 | Ottermann et al. |
| 2012/0061713 A1* | 3/2012 | Tachibana ............... H01L 33/42 257/99 |
| 2012/0153812 A1 | 6/2012 | Aurongzeb et al. |
| 2014/0166986 A1* | 6/2014 | Pang .................... H01L 51/506 257/40 |
| 2015/0028379 A1* | 1/2015 | Chen ...................... H01L 33/42 257/99 |
| 2015/0144906 A1 | 5/2015 | Ichikawa |
| 2015/0287953 A1* | 10/2015 | Ozeki ................ H01L 51/5215 428/457 |
| 2018/0047926 A1* | 2/2018 | Tanaka ............... H01L 51/5072 |

* cited by examiner

LIGHT-EMITTING DEVICE HAVING AN ELECTRODE WITH VARYING SHEET RESISTANCE

This application claims priority to provisional patent application No. 62/201,209, filed Aug. 5, 2015, which is hereby incorporated by reference herein in its entirety.

BACKGROUND

This relates generally to light sources and, more particularly, to organic light-emitting diodes.

It may be desirable to form light sources from organic light-emitting diode structures. Some organic light-emitting diode structures are formed on transparent substrates and have transparent electrodes so that a viewer can view through the organic light-emitting diode structure. If care is not taken, structures such as these can exhibit non-uniform light distribution characteristics. Non-uniform light emission may adversely impact the performance of a device that is using emitted light from the organic light-emitting diode.

It would therefore be desirable to be able to provide improved light-emitting devices such as organic light-emitting diodes.

SUMMARY

An organic light-emitting diode may have electrodes. The electrodes may be transparent electrodes. A layer of light-emitting material such as a layer that contains an emissive organic layer may be interposed between the electrodes. The layer of light-emitting material may emit light in response to current applied by the electrodes.

The organic light-emitting diode electrodes may cover an electrode area. To enhance brightness uniformity, portions of the electrodes in a peripheral region of the electrode area may have higher sheet resistances than a central portion of the electrode area. The electrode area may be square or may have other shapes. The higher sheet resistances may be associated with regions of the electrode area that are adjacent to corners of the electrode area. Sheet resistance differences may be produced by forming the electrodes with different thicknesses in different areas of the electrodes, by providing supplemental conductive structures or supplemental insulating structures in selected areas, or by modifying the composition or crystallinity of the electrode material.

Further features of the invention, its nature and various advantages will be more apparent from the accompanying drawings and the following detailed description.

DETAILED DESCRIPTION

Light-emitting devices such as organic light-emitting diodes may be used to provide illumination as part of a lighting system for a building, may be used to create an interior or exterior light source for a vehicle, may be used to provide backlight for a display or other light modulator, may be mounted on transparent or opaque support structures, may be incorporated into portable devices, or may be incorporated into other system environments.

Figure 1:
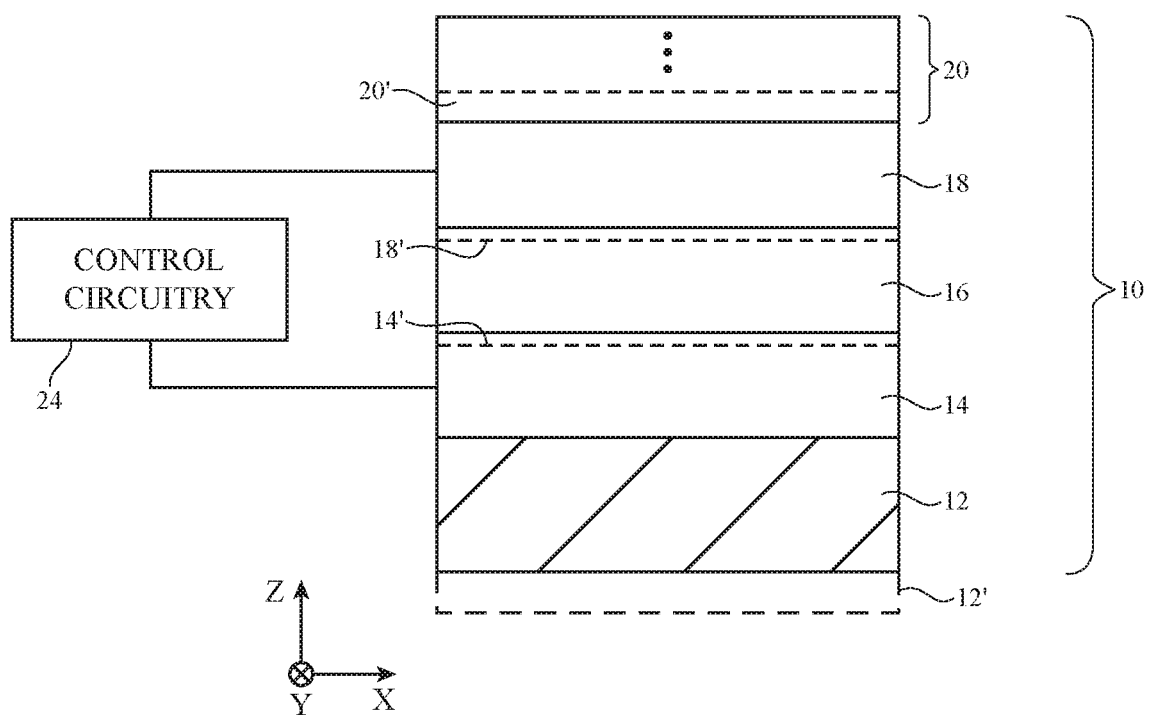
FIG. 1 is a cross-sectional side view of an illustrative light-emitting device in accordance with an embodiment.

A cross-sectional side view of an illustrative organic light-emitting diode is shown in FIG. 1. As shown in FIG. 1, organic light-emitting diode 10 of FIG. 1 may have a light-emitting layer such as layer 16 interposed between a pair of electrode layers such as electrodes 14 and 18. During operation, control circuitry 24 may apply an electrical signal to electrodes 14 and 18 that causes current to flow through layer 16. Control circuitry 24 may include storage and processing circuitry. The storage and processing circuitry may include storage such as hard disk drive storage, non-volatile memory (e.g., flash memory or other electrically-programmable-read-only memory configured to form a solid state drive), volatile memory (e.g., static or dynamic random-access-memory), etc. Processing circuitry in control circuitry 24 may be used to control the current through diode 10 and therefore the amount of light output of diode 10 in response to sensor input, user input, date and time information, received wireless data, or other inputs. The processing circuitry may be based on one or more microprocessors, microcontrollers, digital signal processors, baseband processors, power management units, audio chips, application specific integrated circuits, electronic control units, etc.

As current flows through layer 16, layer 16 and therefore device 10 emits light (e.g., visible light). Electrode 14 and/or electrode 18 may be transparent (e.g., fully transparent or at least semi-transparent), so that emitted light travels outwardly through electrode 14 and/or electrode 18. If desired, reflective layers, light-modulator layers, light extraction enhancement layers, color filter layers, opaque patterned masking layers, adjustable mirrors, display pixel arrays, and other structures may be placed adjacent to one or both sides of diode 10 to control the emitted light.

Layer 16 may include light-emitting material such as an organic emissive layer. The organic emissive layer may be sandwiched between additional diode layers such as hole injection layers, hole transport layers, electron injection layers, and electron transport layers. The emissive material may be a material such as a phosphorescent material or fluorescent material that emits light during diode operation. The emissive layer may be a red emissive layer that emits red light, a blue emissive layer that emits blue light, a green emissive layer that emits green light, a yellow emissive layer that emits yellow light, may be configured to emit light of other colors (e.g., white light, orange light, blue-green light, etc.), or may be any other suitable emissive material. The emissive material may be patterned to form areas of different colors. For example, diode 10 may have some portions that emit red light and other portions that emit yellow light (as an example).

The outline of diode 10 when viewed from above (i.e., the shape of diode 10 in the X-Y plane when viewed along the Z axis of FIG. 1) may be rectangular, square, triangular, circular, oval, may be a shape with curved edges, a shape with straight edges, or a shape with curved and/or straight edges. Configurations in which diode 10 has a planar rectangular shape (i.e., configurations in which diode 10 lies in the X-Y plane of FIG. 1 and has a rectangular outline) are sometimes described herein as an example. This is, however, merely illustrative. Other shapes and configurations may be used for diode 10 if desired (e.g., diode 10 may have openings, may have an footprint and/or patterned emissive layer regions that form text or icons, may have a curved profile, may have a surface with compound curves, may have a surface with one or more bends, etc.). The area occupied by diode 10 (e.g., the surface area of diode 10 in the X-Y plane) may be 10 cm$^2$ or more, may be 10 cm$^2$ to 1000 cm$^2$, may be more than 1 cm$^2$, may be less than 1000 cm$^2$, may be more than 1000 cm$^2$, may be more than 10,000 cm$^2$, may be 100-10,000 cm$^2$, or may be any other suitable area.

Electrodes 14 and/or 18 may be formed from transparent conductive materials. The transparent conductive materials may be organic, inorganic, metal, or combinations of these materials. As an example, the transparent conductive materials may be transparent inorganic materials such as indium tin oxide, zinc oxide, or other transparent conducting oxides. Other transparent conducting materials such as Ag nanowires, carbon nanotubes, graphene and/or metal layers (e.g., metal layers such as thin Mg—Ag or other silver alloys that are sufficiently thin to render the electrodes transparent) may also be used. Electrodes 14 and/or 18 may also be formed from transparent conductive organic materials such as conducting polymers (e.g., PEDOT:PSS and PANI).

Diode 10 may be formed on a substrate such as substrate 12. Substrate 12 may be formed from glass, polymer, ceramic, or other material. For example, substrate 12 may be part of a window for a vehicle or building (e.g., a window formed from glass, plastic, and/or laminated layers of glass and/or plastic), may be a plastic film that is attached to a window or other transparent support layer, may be part of a display layer (e.g., part of a backlight structure in a display), or may be any other suitable supporting layer. In configurations in which substrate 12 is transparent and in which the other layers of diode 10 are transparent, diode 10 may have a transparent appearance (e.g., a user may view objects through diode 10). This may allow diode 10 to be placed in an environment in which diode 10 can display information for the user when illuminated and in which the user can view objects in the surrounding area through diode 10 (e.g., while diode 10 is illuminated and/or while diode 10 is off).

If desired, one or more additional layers may be formed under layer 12 such as layers (sublayers) 12'. Sublayers 12' may include an index-of-refraction-matching layer (e.g., an index-matched adhesive that attaches a multilayer encapsulation layer to electrode 14), antireflection coatings, or other layers of plastic, glass, or other transparent structures, scratch protection layers (sometimes referred to as hard coatings), antistatic layers, and/or other layers of material.

If desired, one or more additional layers may be formed on diode 10 such as additional layer 20. Additional layer 20 may include one or more sublayers 20' and may include moisture barrier films, adhesive, an air gap separating a layer of glass or other moisture barrier layer from electrode 18, a multilayer encapsulation film (moisture barrier layer) containing one or more inorganic and/or organic layers, an index-of-refraction-matching layer (e.g., an index-matched adhesive that attaches a multilayer encapsulation layer to electrode 18), antireflection coatings, or other layers of plastic, glass, other transparent structures, light modulator layers (e.g., light modulators that modulate light evenly over all of the surface of diode 10 and/or light modulator layers with selectively controlled areas such as array of pixels and/or predefined shapes), scratch protection layers (sometimes referred to as hard coatings), antistatic layers, and/or other layers of material.

During operation, current flows from one of electrodes 14 and 18 to the other through layer 16. One of the electrodes in diode 10 serves as an anode (positive diode terminal) and one of the electrodes serves as a cathode (negative diode terminal). The cathode may be the outer terminal or the inner terminal in FIG. 1 and the anode may respectively be the inner or outer terminal.

Figure 2:
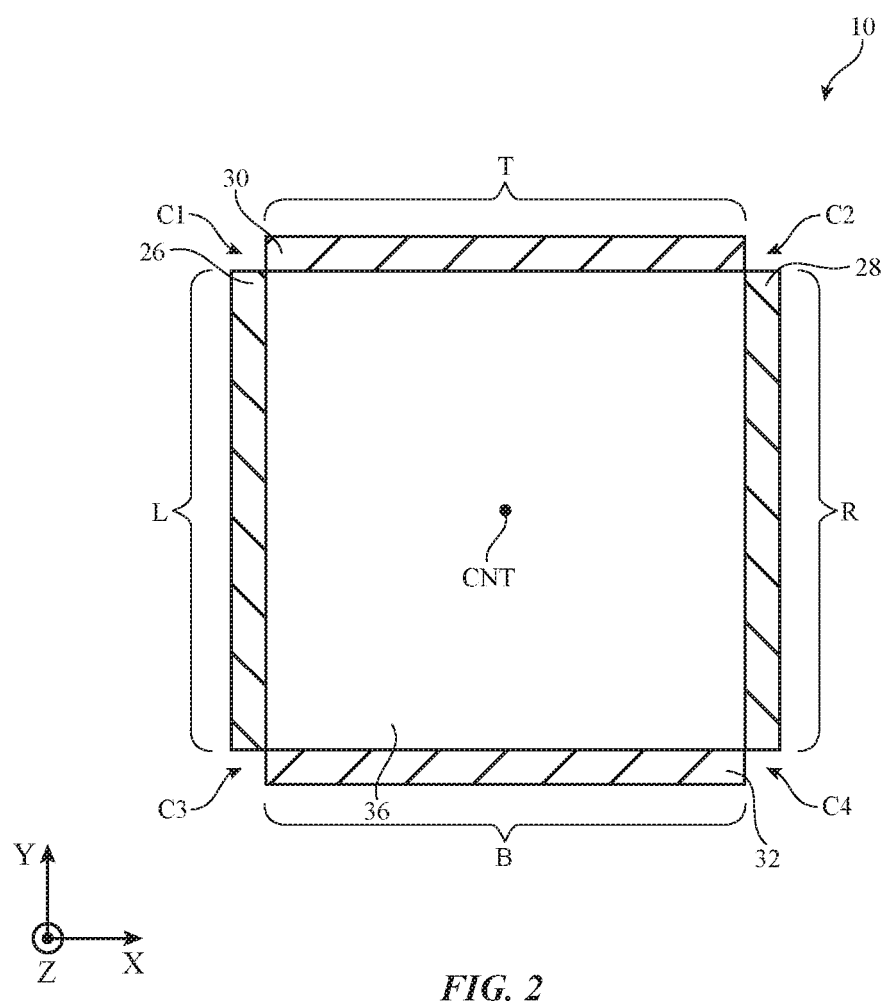
FIG. 2 is a top view of an illustrative light-emitting device in accordance with an embodiment.

A top view of diode 10 in an illustrative configuration in which diode 10 has a square footprint (i.e., a square electrode area 36 that overlaps corresponding square electrodes 18 and 14) is shown in FIG. 2. The shape of diode 10 of FIG. 2 is merely illustrative. Other diode shapes may be used if desired.

In the FIG. 2 example, electrode 18 is coupled to metal strips that form contacts 26 and 28 along the left (L) and right (R) edges of diode 10 and electrode 14 is coupled to metal strips that form contacts 30 and 32 that run along the upper (T) and lower (B) edge of diode 10. Contacts 26 and 28 form a first terminal for diode 10 (e.g., the cathode terminal) and contacts 30 and 32 form a second terminal for diode 10 (e.g., the anode terminal). Because contacts 26, 28, 30, and 32 are formed from metal, these structures may be more conductive than electrodes 14 and 18, which may be formed from relatively thin layers of transparent conducting oxide, and therefore help distribute signals laterally without exhibiting undue voltage drops due to ohmic losses. There are two pairs of contact structures associated with each of the electrodes in diode 10 in the example of FIG. 2, but different arrangements may be used if desired (e.g., each electrode may have a single metal contact strip that runs along one of its edges, each electrode may have three or four metal contact strips along three or four respective edges, the metal contact strips of the cathode and anode may all run vertically or may all run horizontally, curved shapes may be used for the peripheral metal contacts of each electrode, or other patterns may be used for the contacts coupled to electrode layers 14 and 18.

As current flows between electrodes 14 and 18, layer 16 emits light. The intensity of the light that is emitted in each portion of diode 10 is proportional to the current that flows through the emissive material at that portion of diode 10. The use of high conductivity structures such as contacts 26, 28, 30, and 32 may help laterally distribute current along the edges of diode 10 without appreciable ohmic losses, but as current flows inwardly from the contacts toward the in the center of diode 10 (i.e., towards the central region of electrode area 36 overlapping center CNT), the relatively high sheet resistance of electrodes 14 and 18 may give rise to ohmic losses in electrodes 14 and 18. For example, there may be a non-negligible voltage drop in the voltage on electrode 18 as current flows inwardly along dimension X in electrode 18 from contacts 26 and 28 and there may be non-negligible voltage drop in the voltage on electrode 14 as current flows outwardly along dimension Y in electrode 14 from contacts 30 and 32.

Figure 3:
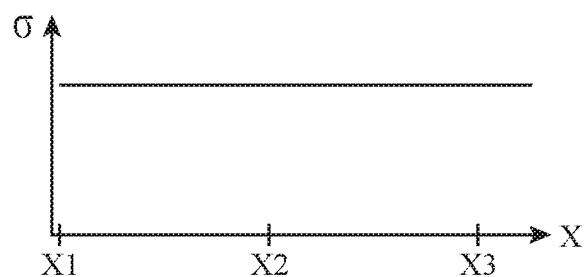
FIG. 3 is a graph in which electrode sheet resistance has been plotted as a function of distance for a light-emitting device electrode.
Figure 4:
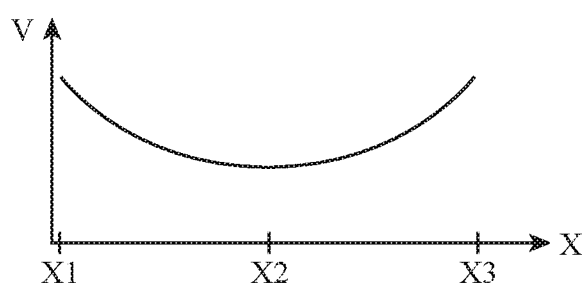
FIG. 4 is a graph in which electrode voltage has been plotted as a function of distance across the light-emitting device electrode of FIG. 3.
Figure 5:
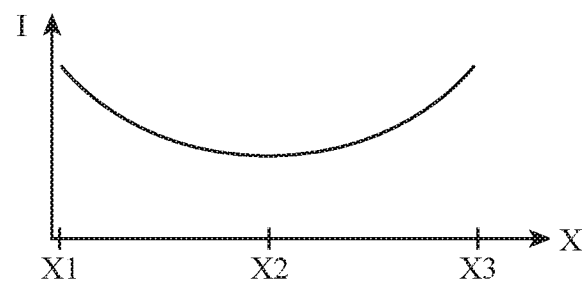
FIG. 5 is a graph in which emitted light intensity has been plotted as a function of distance across the light-emitting device electrode of FIG. 3.

FIGS. 3, 4, and 5 illustrate the potential impact of using a relatively high sheet resistance material such as indium tin oxide in a diode (e.g., a diode with a relatively large surface area). In the example of FIGS. 3, 4, and 5, a square diode electrode such as electrode 18 is coupled to metal contacts such as contacts 26 and 28 along edges L and R, respectively. Contact 26 is located at position X1 and contact 28 is located at position X3. The center of electrode 18 along the X-axis is X2. The sheet resistance 6 of electrode 18 (in this illustrative scenario) is constant as a function of distance X across the electrode. Ohmic losses in electrode 14 are being ignored for this example. Because the sheet resistant of electrode 14 is constant, there is a voltage drop in voltage V on the electrode as a function of distance towards central location X2 due to ohmic losses in the electrode (FIG. 4). The current flowing through the emissive material of the diode will drop in proportion to the voltage drop of FIG. 4, leading to a drop in diode brightness (emitted light intensity) I towards center position Y2, as shown in FIG. 5. As this one-dimensional example demonstrates, there is a risk that the use of a uniform sheet resistance in a diode electrode will lead to undesirably non-uniform emitted light levels from the diode (i.e., hotspots near contacts 26 and 28).

In a scenario in which both electrode 14 and electrode 18 have constant sheet resistances, there is a potential for elevated amounts of current to flow through the emissive material of layer 16 in the peripheral region of the electrodes adjacent to corners C1, C2, C3, and C4 of diode 10. This is because there are short current paths through the anode and cathode in these regions. The use of uniform sheet resistances for electrodes 14 and 18 therefore presents a risk that areas of excessive light output (hotspots) will develop at the corners of diode 10 and that the central region of diode 10 will be overly dim.

To help enhance the uniformity of the brightness of diode 10, one or both of the electrodes of diode 10 may be provided with a non-uniform sheet resistance. For example, the sheet resistance of each electrode may be locally increased in the vicinity of corners C1, C2, C3, and C4. Any suitable pattern may be used for adjusting the electrode sheet resistance as a function of lateral position within the electrode. As shown in the illustrative configuration of FIG. 6, one or both of the electrodes of diode 10 (i.e., electrode 14 and/or electrode 18) may be provided with sheet resistances that are highest in regions H1 near corners C1, C2, C3, and C4, that are lowest in central diode region H3 overlapping the center CNT of diode 10, and that have an intermediate value H2 between regions H1 and H3.

Figure 6:
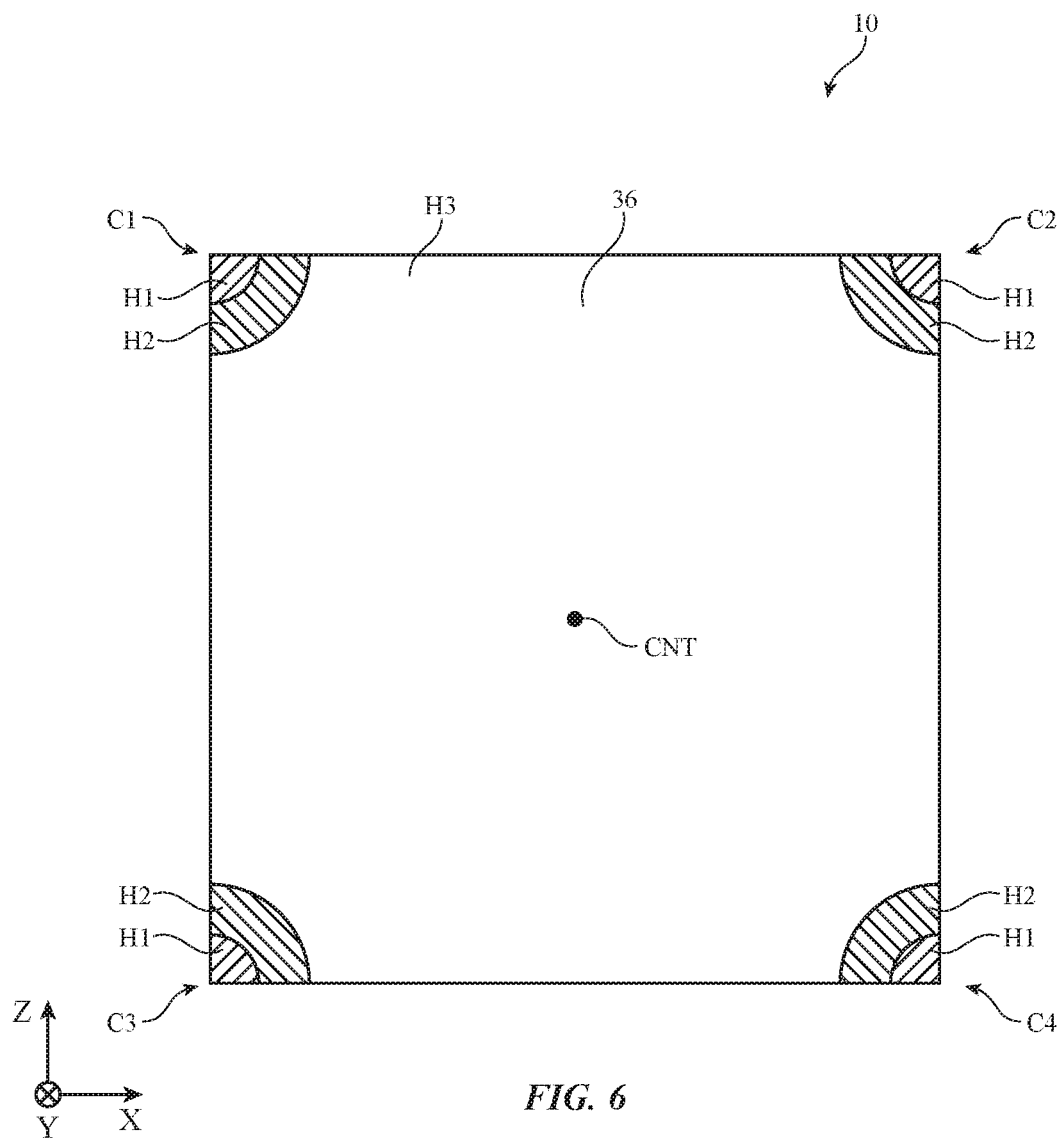
FIG. 6 is a top view of an illustrative electrode with areas having different sheet resistances in accordance with an embodiment.

Three different sheet resistance values (e.g., SR1, SR2, and SR3) may be used respectively in areas H1, H2, and H3. The values of the sheet resistance of electrodes 14 and 18 in regions H1, H2, and H3 may be, as an example 50 ohm/sq, 30 ohm/sq, and 10 ohm/sq. Other values may be used if desired. These values are merely an example. Moreover, any number of different regions on the electrodes may be provided with distinct sheet resistance values (e.g., more than one region may have different sheet resistances, more than two, more than three, more than five, more than 10, 2-20, 2-4, 2-7, fewer than ten, fewer than five, etc.). The use of three distinct sheet resistance regions in the example of FIG. 6 is illustrative. If desired, sheet resistance values may be varied smoothly (i.e., continuously without discrete steps). The use of stepwise changes in sheet resistance in the configuration of FIG. 6 is illustrative.

Sheet resistance for the diode electrodes may be altered using patterns that are different than the illustrative pattern of FIG. 6 (e.g., patterns with non-curved edges, etc.). In diodes with different patterns of contacts, it may be desirable to locally increase sheet resistance in areas of the diode electrodes other than corners C1, C2, C3, and C4. In the example of FIG. 2, the path from the anode contacts to the cathode contacts through the anode and cathode layers is shortest near corners C1, C2, C3, and C4. As a result, increasing the sheet resistance of the electrodes near corners C1, C2, C3, and C4 will tend to counteract the higher currents that would otherwise be associated with the peripheral portions of the emissive layer material that would receive current through these short current paths. In diodes with different layouts, the shortest paths through the anode and cathode layers may be located in different portions of the diode. Accordingly, it may be desirable to use electrode patterns where the highest sheet resistance areas are located at non-corner peripheral portions of the diode electrodes or elsewhere in the diode electrodes.

Any suitable technique may be used to lower the sheet resistance of the diode electrodes near the central portion of the electrodes relative to locations near the corners or other peripheral region(s) of diode 10. As an example, sheet resistance can be locally enhanced in the peripheral portion of diode 10 relative to the central portion by selectively adjusting electrode thickness, by adjusting electrode composition as a function of location, by selectively adding patterned supplemental conductive structures to the electrodes (e.g., a layer of thin transparent metal structures or additional transparent conductive oxide materials such as indium tin oxide or other wide bandgap semiconductors), and/or by otherwise adjusting the sheet resistance of the electrode structures as a function of position on the electrode.

Figure 7:
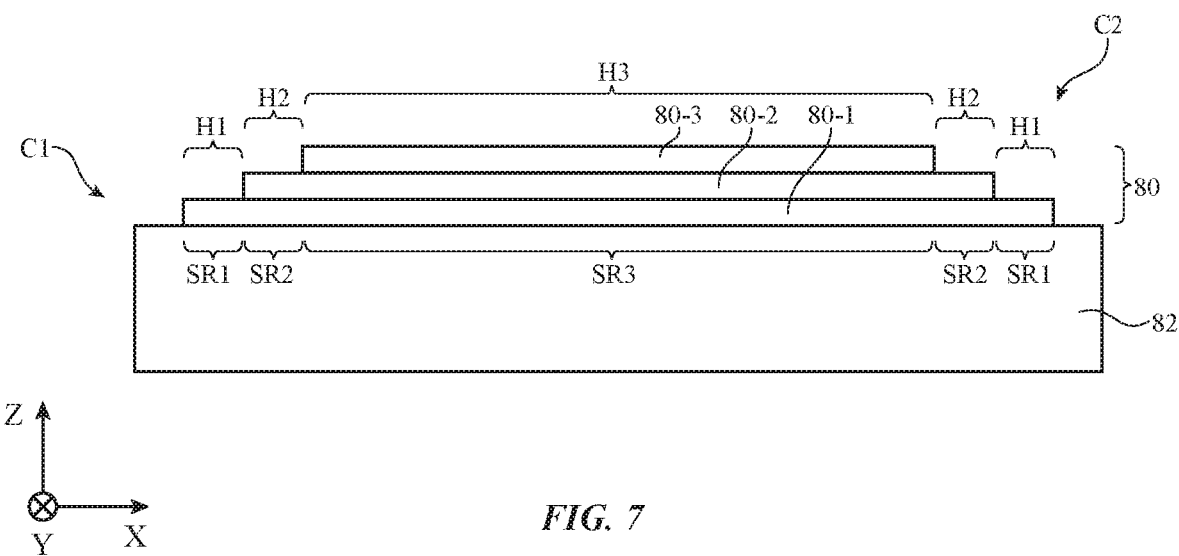
FIG. 7 is a cross-sectional side view of an illustrative electrode with areas having different thicknesses to provide the electrode with corresponding different sheet resistances in accordance with an embodiment.

With one illustrative configuration, electrodes 14 and 18 may be deposited by using shadow masks to form layers with different shapes. Consider, as an example, the illustrative electrode shown in FIG. 7. In the example of FIG. 7, electrode 80 (e.g., electrode 14 or electrode 18 of FIG. 1) has three layers 80-1, 80-1, and 80-3 and is formed on other layers of diode 10 (see, e.g., layer 82, which may be a substrate layer such as layer 12, light-emitting layer 16, etc.). To create an increased sheet resistance for electrode 80 near the corners of diode 10 (see, e.g., illustrative corners C1 and C2), electrode 80 is thinned near corners C1 and C2. Layers 80-1, 80-2, and 80-3 may have any suitable thicknesses (e.g., 10-200 nm, more than 5 nm, more than 50 nm, less than 150 nm, less than 250 nm, etc.). Electrode layer 80 may be thinned by etching, by depositing layers 80-1, 80-2, and 80-3 through different shadow masks during deposition (e.g., during sputtering), or by using other deposition and patterning techniques. As an example, layer 80-1 may be deposited without using a shadow mask, so that regions such as regions H1, H2, and H3 of FIG. 6 are all uncovered. Layer

80-2 may then be deposited using a shadow mask that covers regions H1, which increases the thickness of layer 80 in regions H2 and H3 but not region H1. Layer 80-3 may then be deposited through a shadow mask that covers regions H1 and H2, so that the thickness of electrode 80 is greatest in region H3.

In some situations, thickness changes in different regions of layer 80 may result in different optical characteristics (e.g., due to different optical distances associated with light passing through these different regions). If desired, local sheet resistance modifications can be made without involving thickness changes in layer 80. With one suitable arrangement, the sheet resistance of layer 80 may be reduced by annealing (e.g., by applying heat selectively in the center of diode 10 so that the regions of diode 10 near the periphery of diode 10 have higher sheet resistance or by otherwise applying selective annealing treatments to different sections of electrodes such as electrode 14). Using this type of approach, the center of layer 80 may be fully annealed after depositing the electrode. The annealing temperature and therefore the amount of applied annealing may be reduced towards the periphery of layer 80. If desired, the chemical composition of the indium tin oxide (e.g., the amount of indium, tin, and oxygen in the indium tin oxide material) for the electrode can be adjusted selectively to adjust sheet resistance. As an example, the conductivity of an indium tin oxide layer may be increased in the center of diode 10 by increasing the density of tin and/or the number of oxygen vacancies in layer 80. The chemical composition of layer 80 may be altered in this way during electrode deposition (e.g., during indium tin oxide layer deposition) and/or may be altered after deposition (e.g., by local laser treatment or other processes that modify the composition of layer 80). Atomic and/or ion implantation processes may also be used to make local modifications of the deposited layer.

Using an arrangement of the type shown in FIG. 7, the sheet resistance of corners H1 (SR1) may be greater than the sheet resistance SR3 of central portion H3 and the sheet resistance SR2 of layer 80 in intermediate region H2 may be between the values of sheet resistance SR1 and sheet resistance SR3.

Figure 8:
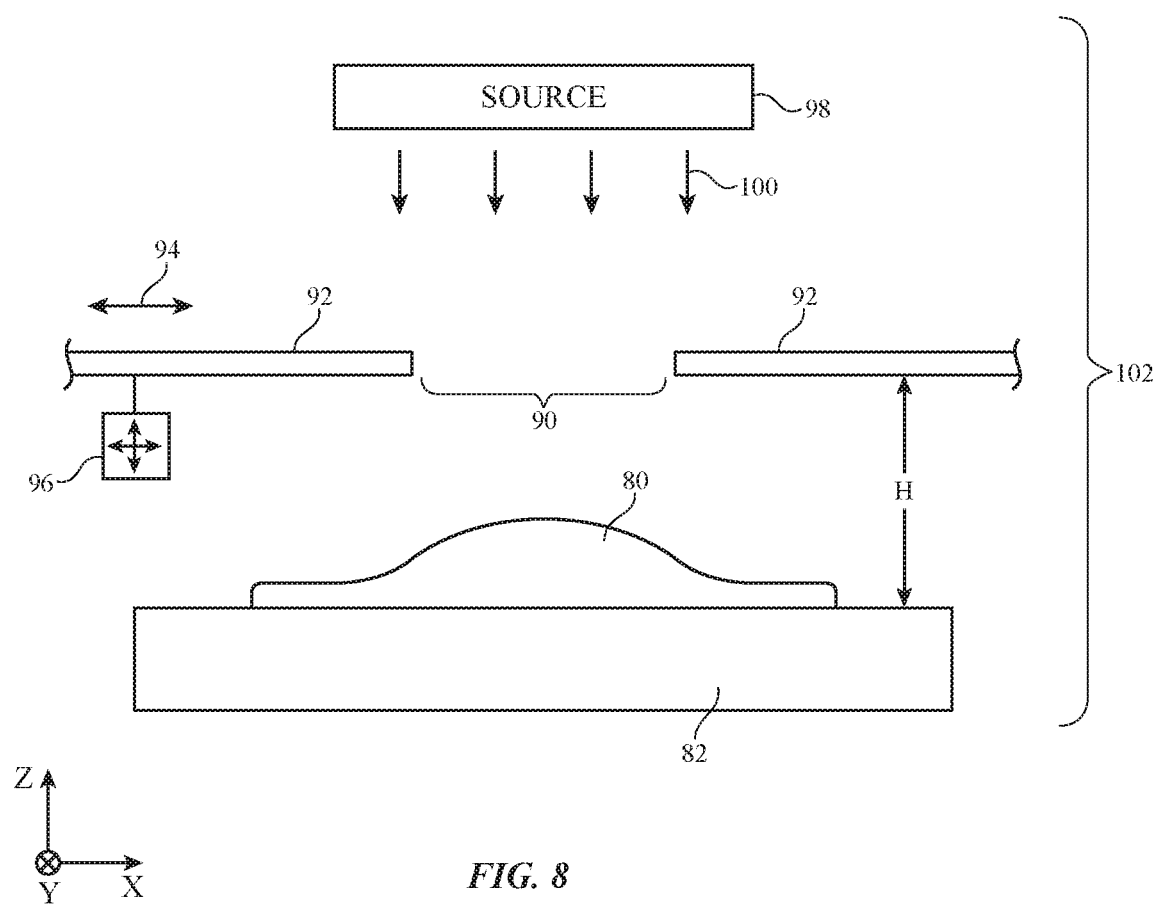
FIG. 8 is a side view of an illustrative electrode deposition tool being used to deposit an electrode with a thickness and sheet resistance that varies as a function of position on a substrate in accordance with an embodiment.

Another illustrative technique for spatially varying the sheet resistance of electrode 80 as a function of lateral position across electrode 80 is shown in FIG. 8. Deposition system 102 of FIG. 8 has a source of electrode material (e.g., a sputtering source) such as source 98 that produces electrode material 100 (e.g., a transparent conducting oxide such as indium tin oxide or zinc oxide). Mask 92 may have an opening such as opening 90. In regions of mask 92 without opening 90, material 100 is blocked and does not deposit to form a portion of electrode 80. In opening 90, material 100 is allowed to deposit on layer 80, thereby increasing the thickness of layer 80. To help smooth the thickness transition between the lower-thickness corners regions of electrode 80 and the higher-thickness central region of electrode 80, mask 92 may be located at a distance H from layer 82 (i.e., the layer of diode 10 on which electrode 80 is being deposited may be located a distance H below mask 92). The value of H may be 1 mm to 10 cm, may be more than 1 cm, may be less than 20 cm, or may be any other suitable distance. Further smoothing of the thickness changes in the peripheral portions of electrode 80 may be achieved by moving mask 92 in directions 94 with electrically controlled positioner 96 during deposition.

Figure 9:
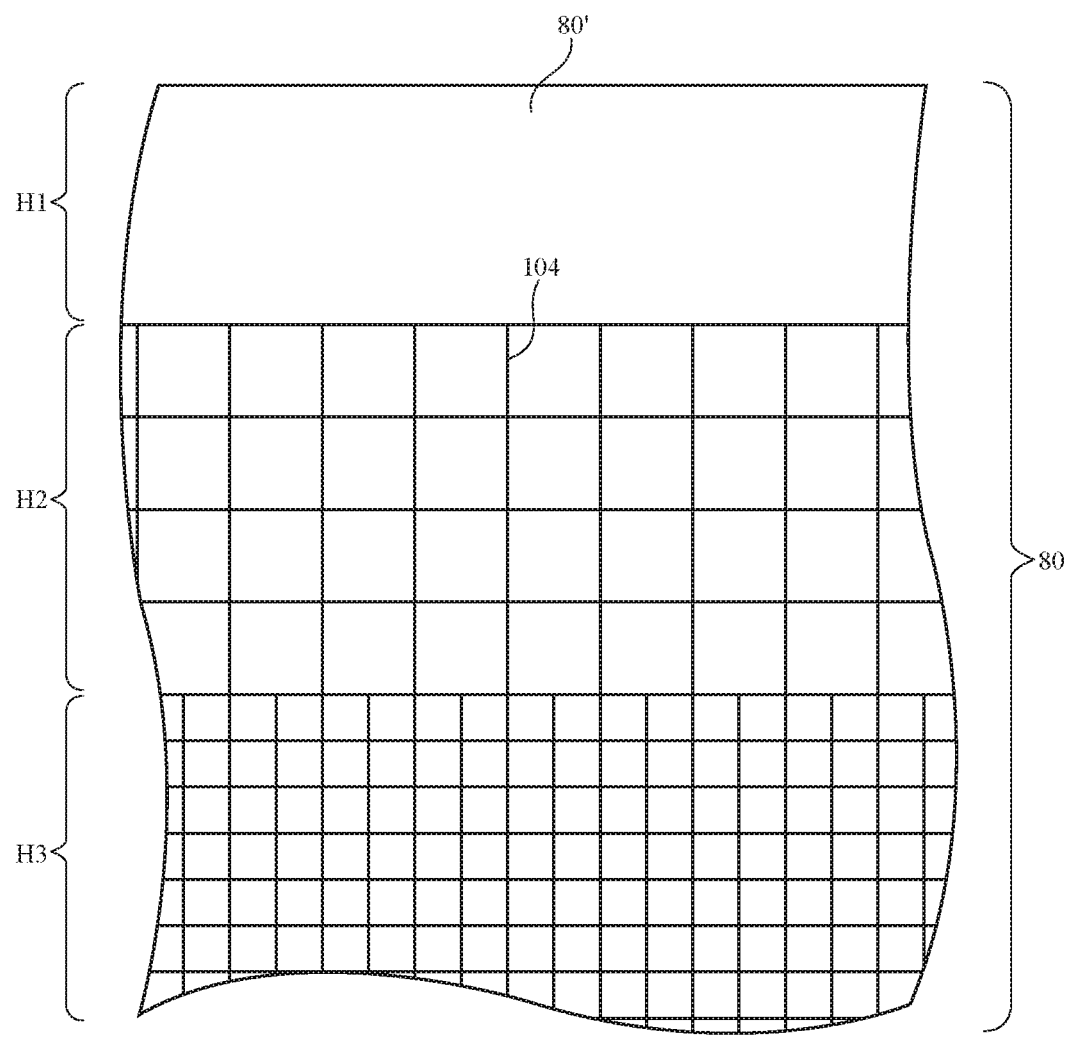
FIG. 9 is a top view of an illustrative electrode having a blanket transparent layer and supplemental conductive structures such as metal lines that provide the electrode with a sheet resistance that varies as a function of position across the surface of the electrode.
Figure 10:
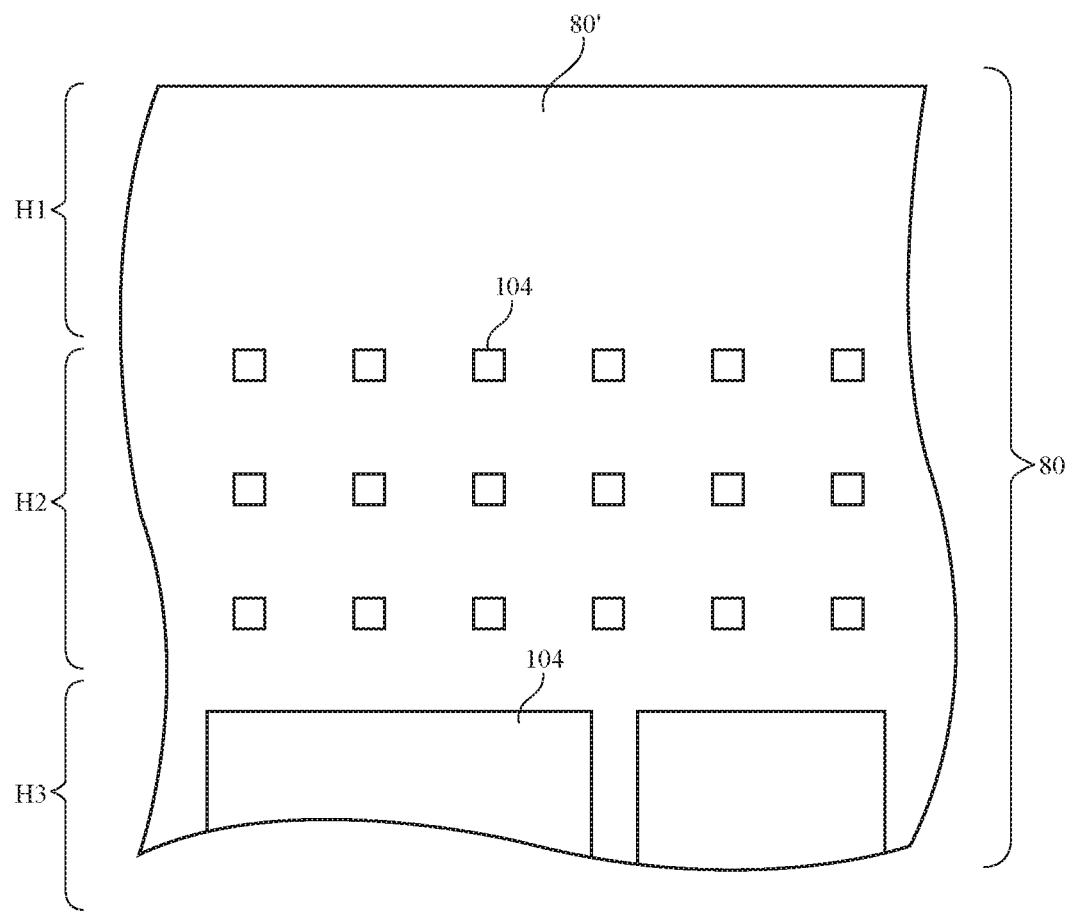
FIG. 10 is a top view of an illustrative electrode having a blanket conductive layer such as a transparent conducting oxide layer covered with a patterned layer to provide the electrode with a sheet resistance that varies as a function of position in accordance with an embodiment.

Another illustrative arrangement for locally increasing the sheet resistance of electrode 80 is shown in FIG. 9. In this example, a blanket film of transparent conductive material 80' (e.g., indium tin oxide or other conducting oxide) has been deposited over all of the electrode area associated with electrode 80 (i.e., areas H1, H2, and H3). To locally reduce the sheet resistance of electrode 80 in region H3, supplemental conductive structures 104 (e.g., metal lines that are sufficiently thin to be invisible to the naked eye) may be deposited and patterned on the surface of the transparent conductive film in region H3 (e.g., using photolithography). Intermediate regions of electrode 80 may be provided with intermediate levels of sheet resistance by selectively varying the density (conductive area per unit area) of supplemental conductive structures on the electrode. For example, the density of metal lines or other supplemental structures in region H2 may be less than the density of metal lines or other supplemental structures in region H3. The supplemental conductive structures may be formed from metal lines or supplemental conductive material with other suitable patterns (e.g., stripes, etc.). A pseudorandom pattern of supplemental conductive structures may be used to help reduce visible artifacts In the example of FIG. 10, supplemental conductive structures 104 have the shape of pads. Grid shapes, pads or other supplemental island-shaped areas, interconnected or island-shaped pseudorandom patterns, dots, strips, or other supplemental conductive structure patterns may be used. In the configuration of FIG. 10, there is a higher density of supplemental conductive material (pad area versus non-pad area) in region H3 than in H2, so the sheet resistance of electrode 80 in area H3 will be lower than the sheet resistance of electrode 80 in area H2.

The supplemental structures of FIG. 10 are larger in area than the supplemental structures of FIG. 9. For example, the metal lines of FIG. 9 may be less than 100 microns, less than 10 microns, less than 1 micron, more than 1 micron, or other suitable small width to render structures 104 of FIG. 9 invisible even when formed from an opaque material such as metal. Pads 104 or other supplemental structures of the type shown in FIG. 10 may be sufficiently large to be visible if formed from opaque material and may therefore be formed from a transparent conductive material such as indium tin oxide, zinc oxide, or other transparent conductive oxide. Pads 104 of FIG. 10 in regions H2 and H3 may be formed simultaneously using a single shadow mask. The mask may be located away from electrode 80 during deposition and/or may be moved during deposition as described in connection with FIG. 8 to help smooth the edges of pads 104 and thereby make pads 104 less visible.

In addition to or instead of modifying the sheet resistance exhibited by the conductive material of layer 80, one or both of the electrodes of diode 10 may be selectively provided with insulation to locally adjust the density of current flowing through layer 16. For example, patterned dielectric layers may be formed on the lower surface of electrode 18 (see, e.g., patterned dielectric layer 18' of FIG. 1) and/or on the upper surface of electrode 14 (see, e.g., patterned dielectric layer 14' of FIG. 1).

A patterned electrical insulation layer such as an electric isolation grid or other pattern having a combination of insulation-present areas and insulation-absent areas (e.g., holes) can be used to help improve current density uniformity and therefore light output uniformity across diode 10. As an example, a layer of photoimageable polymer such as transparent photoresist may be deposited and patterned between layer 16 and layer 18 or between layer 14 and 16 using a density of structures that is the inverse of the supplemental conductive structures of FIG. 10 (i.e., more insulator near the corners and less insulator near the center as opposed to more conductor near the center and less conductor near the corners as with supplemental conductive structures 104). If desired, patterned insulation may be deposited between electrode 14 and layer 16 and/or between layer 16 and 18 by evaporating insulating small molecules through a shadow mask (sometimes referred to as a fine metal mask). The shadow mask may have a density of openings that is greater near peripheral portions of the electrodes than in a central portion of the electrodes. In general, the patterned insulating layer may be formed between the anode and layer 16, between the cathode and layer 16, or between both the anode and layer 16 and the cathode and layer 16.

The patterned insulation layer (sometimes referred to as supplemental insulating structures or supplemental dielectric structures) may be transparent and therefore invisible to a human observer. The transparent small molecule insulation (or photolithographically defined patterned insulating polymer) may have a relatively high density near the periphery of diode 10 and may have a relatively lower density (and may even be absent) in the center of diode 10 to help ensure that the current density through diode 10 and therefore emissive layer 10 is uniform at a function of position within the X-Y plane.

Patterns of the type shown in FIG. 10 for structure 104 or other suitable patterns may be used when forming the invisible insulating structures. Invisible insulation structures may have a higher density near the corners or other peripheral portions of diode 10 and may have a lower density (or may be completely absent) near the center of diode 10. The presence of patterned insulating layer structures that have a greater density (amount of insulating film area versus uncovered film area) may help ensure that the average light output at the corners of diode 10 will be reduced and will match the center of diode 10.

If desired, subtractive patterning techniques (e.g., wet or dry etching) may be used in forming locally thinned electrode regions that exhibit enhanced sheet resistance. Other approaches or combinations of these approaches may also be used.

Figure 11:
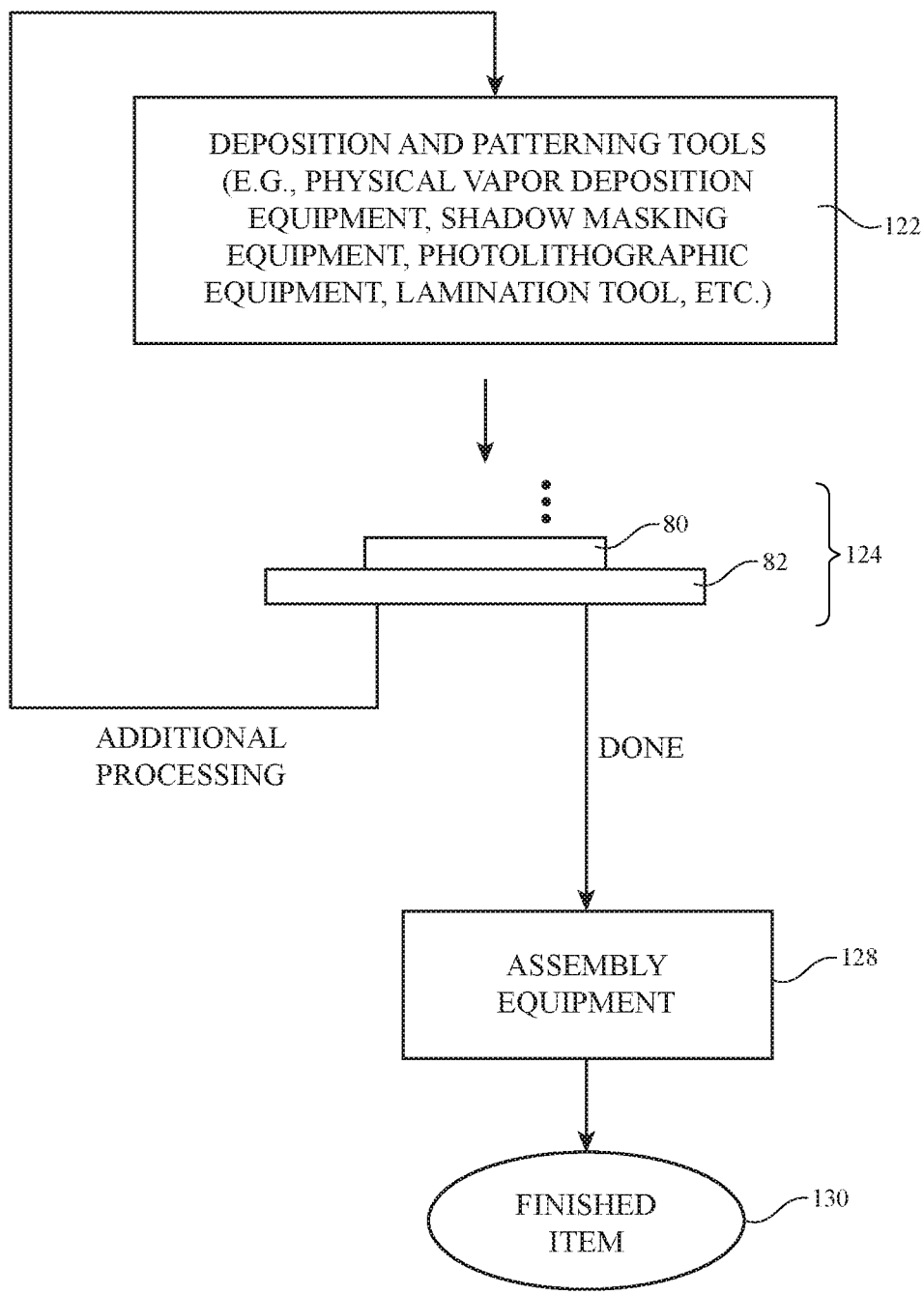
FIG. 11 is a diagram showing equipment and operations involved in fabricating a light-emitting device in accordance with an embodiment.

FIG. 11 is a diagram of illustrative equipment and operations that may be used in forming diodes with enhanced brightness uniformity. As shown in FIG. 11, deposition and patterning tools 122 may be used to deposit and pattern the layers of diode 10 (e.g., structures 124) such as one or more layers of material for electrodes 14 and 18 (see, e.g., electrode 80 on layer 82). Tools 122 may include tools for depositing material such as physical vapor deposition tools (e.g., equipment for sputtering indium tin oxide and other transparent conductive layers, evaporation equipment, etc.), chemical vapor deposition tools (e.g., plasma enhanced chemical vapor deposition tools, atomic layer deposition tools, etc.), evaporation tools or other tools for depositing layer 16, shadow mask equipment for patterning sputtered or evaporated material, spin coating equipment for depositing conductive polymers, equipment for depositing material by ink-jet printing, nozzle printing, pad printing, slit coating, dripping, spraying, and other deposition techniques suitable for depositing liquid polymer materials (e.g., conductive polymers or insulating polymers), photolithography equipment for patterning photoresist, etching equipment for removing material selectively, laser processing equipment for ablating material and/or applying heat and or light that adjusts the properties of electrode material or other material in desired regions of diode 10, equipment for laminating together a moisture barrier film and underlying diode structures using adhesive, etc.

Tools 122 may be used to deposit electrode layers in sequence (e.g., to build up central portions of an electrode more than peripheral portions as described in connection with the stepwise thickening arrangement of FIG. 7), may be used to deposit an electrode layer with a continuously (non-stepwise) varying thickness as shown in FIG. 8, may be used to deposit and pattern thin metal films (e.g., to create thin metal wires or other invisible metal supplemental conductive structures as described in connection with FIG. 9), may be used to deposit pad-shaped supplemental conductive structures or other supplemental conductive structures formed from transparent conductive material such as indium tin oxide or other transparent conductive oxides as described in connection with FIG. 10, or may be used to selectively remove material or selectively modify material in electrode 80 to adjust sheet resistance.

Once diode 10 has been fabricated, diode 10 may be assembled with other structures to form a finished item such as item 130 using assembly equipment 128. If, for example, diode 10 is being used to form a display backlight, a pixel array may be attached to diode 10. If diode 10 is being formed on a transparent substrate such as a plastic film, the film may be attached to a window or other glass panel. In configurations in which diode 10 is being formed on a transparent glass substrate for a window or other glass-based structure, the glass substrate may be mounted in a support structure such as a frame. Glass-based substrates, plastic substrates, and other transparent support structures may be used in forming diode 10 (e.g., substrate 12 of FIG. 1) or diode 10 may be coupled to a transparent glass or plastic window or other transparent layer using adhesive or other attachment mechanisms. During operation, the emissive material of layer 16 in diode 10 may emit light in response to applied current from control circuitry 24.

In accordance with an embodiment, a light-emitting diode is provided that includes a first electrode, a second electrode, and a layer of light-emitting material between the first and second electrode, at least the first electrode has a sheet resistance that is different in different areas of the first electrode.

In accordance with another embodiment, the first and second electrodes are transparent.

In accordance with another embodiment, the light-emitting material includes a layer of organic emissive material that emits light in response to current applied between the first and second electrodes.

In accordance with another embodiment, the first and second electrodes include transparent conductive oxide.

In accordance with another embodiment, the first and second electrodes are formed from indium tin oxide and wherein the first and second electrodes have an area of at least 10 cm$^2$.

In accordance with another embodiment, the first and second electrodes are square and each have four edges and four corners and the first and second electrodes have sheet resistances that are elevated adjacent to the corners relative to a central area of the first and second electrodes.

In accordance with another embodiment, the first and second electrodes each have corners and the first and second electrodes have sheet resistances that are elevated adjacent to the corners relative to a central area of the first and second electrodes.

In accordance with another embodiment, the first and second electrodes each include a single layer of conductive material in a region of the electrode area that is adjacent to the corners and have multiple layers of the conductive material in other regions of the electrode area.

In accordance with another embodiment, the first electrode has a transparent conductive oxide layer, a region of the transparent conductive oxide layer has supplemental conductive structures that reduce the sheet resistance of the first electrode in the region relative to other regions of the transparent conductive oxide layer.

In accordance with another embodiment, the supplemental conductive structures include metal lines.

In accordance with another embodiment, the supplemental conductive structures comprise a patterned transparent conductive oxide film.

In accordance with another embodiment, the first electrode has a transparent conductive oxide layer with a continuously varying thickness.

In accordance with an embodiment, a light-emitting device is provided that includes a first electrode, a second electrode, and an organic emissive layer interposed between the first and second electrodes, the first and second electrodes each have layer of transparent material having a peripheral region and a central region and having a sheet resistance that is higher in at least one portion of the peripheral region than the central region.

In accordance with another embodiment, the first and second electrodes each have edges extending between corners, and the sheet resistance that is elevated at the portion of the peripheral region is adjacent to at least one of the corners.

In accordance with another embodiment, the first electrode includes a cathode having first and second metal contacts along first and second opposing edges and the second electrode includes an anode having first and second metal contacts along first and second opposing edges.

In accordance with another embodiment, the first and second metal contacts of the cathode are perpendicular to the first and second metal contacts of the anode.

In accordance with another embodiment, the first and second electrodes include transparent conductive oxide.

In accordance with another embodiment, the transparent conductive oxide of the first electrode is thinner in the portions of the peripheral region adjacent to the corners than the central region and the transparent conductive oxide of the second electrode is thinner in the portions of the peripheral region adjacent to the corners than the central region.

In accordance with an embodiment, a light-emitting diode is provided that includes a substrate, first transparent electrode on the substrate, a second transparent electrode, and a layer of organic emissive material between the first and second transparent electrodes that emits light in response to current applied between the first and second electrodes, at least one of the first and second electrodes has a layer of transparent material having a peripheral region and a central region and having a sheet resistance that is higher in at least one portion of the peripheral region than the central region.

In accordance with another embodiment, the layer of transparent material includes a transparent conducting oxide having a portion that is thinner in the at least one portion of the peripheral region than the central region.

In accordance with an embodiment, a light-emitting diode is provided that includes a substrate, first transparent electrode on the substrate, a second transparent electrode, a layer of organic emissive material between the first and second transparent electrodes that emits light in response to current applied between the first and second electrodes, and a patterned layer of transparent insulator that selectively adjusts current density for the current flowing through the layer of organic emissive material.

In accordance with another embodiment, the patterned layer of transparent insulator is a transparent polymer layer and is interposed between a selected one of the first and second transparent electrodes and the layer of organic emissive material layer, the patterned layer of transparent insulator has a peripheral region and a central region, and the patterned layer of transparent insulator has a higher density of insulation-present areas to insulation-absent areas in at least one portion of the peripheral region than the central region.

In accordance with another embodiment, the patterned layer of transparent insulator includes insulating small molecules.

In accordance with another embodiment, the first transparent electrode includes an anode, the second transparent electrode includes a cathode, and the patterned layer of transparent insulator is interposed between the anode and the layer of organic emissive material.

In accordance with another embodiment, the first transparent electrode includes an anode, the second transparent electrode includes a cathode, and the patterned layer of transparent insulator is interposed between the cathode and the layer of organic emissive material.

The foregoing is merely illustrative and various modifications can be made by those skilled in the art without departing from the scope and spirit of the described embodiments. The foregoing embodiments may be implemented individually or in any combination.

What is claimed is:

1. A light-emitting device, comprising:
a first electrode;
first and second metal strips that are coupled to the first electrode;
a second electrode;
third and fourth metal strips that are coupled to the second electrode; and
a layer of light-emitting material between the first and second electrode, wherein:
the first and second electrodes each have four edges and four corners;
the first and second metal strips are parallel to first and second opposing edges of the four edges;
the third and fourth metal strips are parallel to third and fourth opposing edges of the four edges; and
at least the first electrode has first areas formed in each of the four corners that have a first sheet resistance and a second area in a center of the first electrode that has a second sheet resistance that is lower than the first sheet resistance.

2. The light-emitting device defined in claim 1 wherein the first and second electrodes are transparent.

3. The light-emitting device defined in claim 2 wherein the light-emitting material comprises a layer of organic emissive material that emits light in response to current applied between the first and second electrodes.

4. The light-emitting device defined in claim 3 wherein the first and second electrodes comprise transparent conductive oxide.

5. The light-emitting device defined in claim 4 wherein the first and second electrodes are formed from indium tin oxide and wherein the first and second electrodes each have an area of at least 10 cm$^2$.

6. The light-emitting device defined in claim 1 wherein the first and second electrodes each comprise:
a single layer of conductive material in areas that are adjacent to the four corners, and multiple layers of the conductive material in other areas of the first or second electrode.

7. The light-emitting device defined in claim 1 wherein the first electrode has a transparent conductive oxide layer and wherein a region of the transparent conductive oxide layer has supplemental conductive structures that reduce the sheet resistance of the first electrode in the region relative to other regions of the transparent conductive oxide layer.

8. The light-emitting device defined in claim 7 wherein the supplemental conductive structures include metal lines.

9. The light-emitting device defined in claim 8 wherein the supplemental conductive structures comprise a patterned transparent conductive oxide film.

10. The light-emitting device defined in claim 1 wherein the first electrode has a transparent conductive oxide layer with a continuously varying thickness.

11. A light-emitting device, comprising:
a first electrode;
a second electrode; and
an organic emissive layer interposed between the first and second electrodes, wherein the first and second electrodes each have a layer of transparent material, wherein each layer of transparent material has four corner regions, four edge regions that are each interposed between two respective corner regions, and a central region and wherein a first sheet resistance of the four corner regions is greater than a second sheet resistance of the four edge regions and the central region.

12. The light-emitting device defined in claim 11 wherein the first electrode comprises a cathode having first and second metal contacts along first and second opposing edge regions of the four edge regions of the layer of transparent material for the first electrode and wherein the second electrode comprises an anode having first and second metal contacts along first and second opposing edge regions of the layer of transparent material for the second electrode.

13. The light-emitting device defined in claim 12 wherein the first and second metal contacts of the cathode are perpendicular to the first and second metal contacts of the anode.

14. The light-emitting device defined in claim 13 wherein the first and second electrodes comprise transparent conductive oxide.

15. The light-emitting device defined in claim 14 wherein the transparent conductive oxide of the first electrode is thinner adjacent to the four corner regions than the central region and the four edge regions and wherein the transparent conductive oxide of the second electrode is thinner adjacent to the four corner regions than the central region and the four edge regions.

16. A light-emitting device, comprising:
a substrate;
a first transparent electrode on the substrate;
a second transparent electrode; and
a layer of organic emissive material between the first and second transparent electrodes that emits light in response to current applied between the first and second electrodes, wherein both the first and second transparent electrodes are formed from a transparent conductive layer that has a peripheral region, a central region, and a higher sheet resistance in the peripheral region than in the central region.

17. The light-emitting device defined in claim 16 wherein the layer of transparent material comprises a transparent conducting oxide and wherein at least one portion of the transparent conducting oxide in the peripheral region is thinner than at least one portion of the transparent conducting oxide in the central region.

18. The light-emitting device defined in claim 1, wherein the first electrode has four edge regions that are each interposed between two respective corner regions and wherein the second area that has the second sheet resistance that is lower than the first sheet resistance includes the four edge regions of the first electrode.

19. A light-emitting device, comprising:
an anode having first and second opposing edges and first and second metal contacts along the first and second opposing edges;
a cathode having third and fourth opposing edges and third and fourth metal contacts along the third and fourth opposing edges, wherein the first and second metal contacts are perpendicular to the third and fourth metal contacts; and
an organic emissive layer interposed between the anode and the cathode, wherein at least one of the anode and the cathode has a peripheral portion with a first sheet resistance and a central portion with a second sheet resistance that is lower than the first sheet resistance.

20. The light-emitting device defined in claim 19, wherein the peripheral portion with the first sheet resistance comprises four corner portions and wherein the at least one of the anode and the cathode has four edge portions peripheral portion with the second sheet resistance that is lower than the first sheet resistance.

* * * * *

UNITED STATES PATENT AND TRADEMARK OFFICE
CERTIFICATE OF CORRECTION

PATENT NO. : 10,573,843 B2  
APPLICATION NO. : 15/747097  
DATED : February 25, 2020  
INVENTOR(S) : KiBeom Kim et al.

Page 1 of 1

It is certified that error appears in the above-identified patent and that said Letters Patent is hereby corrected as shown below:

On the Title Page

Left Column, Item (71), "Applicant: PROTEQ TECHNOLOGIES LLC, Wilmington, DE (US)" should read -- Applicant: Apple Inc., Cupertino, CA (US) --

Signed and Sealed this  
Thirtieth Day of March, 2021

Drew Hirshfeld  
*Performing the Functions and Duties of the*  
*Under Secretary of Commerce for Intellectual Property and*  
*Director of the United States Patent and Trademark Office*